(12) United States Patent
Chan et al.

(10) Patent No.: US 7,084,673 B2
(45) Date of Patent: Aug. 1, 2006

(54) OUTPUT DRIVER WITH PULSE TO STATIC CONVERTER

(75) Inventors: Yuen H. Chan, Poughkeepsie, NY (US); Antonio R. Pelella, Highland Falls, NY (US); Jatinder K. Wadhwa, Wappingers Falls, NY (US); Otto M. Wagner, Altdorf (DE)

(73) Assignee: International Business Machines Corporation, Armonk, NY (US)

( * ) Notice: Subject to any disclaimer, the term of this patent is extended or adjusted under 35 U.S.C. 154(b) by 51 days.

(21) Appl. No.: 10/844,298

(22) Filed: May 12, 2004

(65) Prior Publication Data

US 2005/0253639 A1    Nov. 17, 2005

(51) Int. Cl.
*G01R 19/00* (2006.01)
(52) U.S. Cl. ............ 327/55; 377/57; 377/200; 377/208
(58) Field of Classification Search ............ 327/55, 327/57
See application file for complete search history.

(56) References Cited

U.S. PATENT DOCUMENTS

| | | | | |
|---|---|---|---|---|
| 3,356,858 A | * | 12/1967 | Wanlass | 326/103 |
| 5,311,070 A | * | 5/1994 | Dooley | 327/208 |
| 5,461,331 A | | 10/1995 | Schorn | 327/210 |
| 5,495,188 A | | 2/1996 | Chen et al. | 326/93 |
| 5,619,157 A | | 4/1997 | Kumata et al. | 327/203 |
| 5,973,529 A | * | 10/1999 | Chappell et al. | 327/200 |
| 6,566,927 B1 | * | 5/2003 | Park et al. | 327/211 |
| 6,756,823 B1 | * | 6/2004 | Chen et al. | 327/55 |

* cited by examiner

*Primary Examiner*—Long Nguyen
(74) *Attorney, Agent, or Firm*—Lynn L. Augspurger; Laurence L. Marhoefer

(57) ABSTRACT

A pulse to static converter for SRAM in which the converter latch is comprised of two cross-coupled, complementary, FET pairs. The FETs of each pair are coupled drain to drain between a positive voltage source and ground. The output state of SRAM sense amplifier is coupled as an input to the grates of one FET pair and the state established by this input is latched via the cross coupling with the other FET pair.

2 Claims, 4 Drawing Sheets

OUTPUT DRIVER WITH PULSE TO STATIC CONVERTER

RELATED APPLICATIONS

This application is related to the following U.S. patent applications filled of even date with this application, and assigned to the assignee of this application, and incorporated herein by reference: High Performance Programmable Array Local Clock Generator, Ser. No. 10/843,991, filed May. 12, 2004, issued as U.S. Pat. No. 6,860,460 on Feb. 1, 2005; Cache Late Select Circuit, Ser. No. 10/844,296, filed on May. 12, 2004; and Programmable Sense Amplifier Timing Generator, Ser. No. 10/844,301, filed May. 12, 2004, issued as U.S. Pat. No. 6,958,943 on Oct. 25, 2005.

FIELD OF THE INVENTION

This invention relates to an improved pulse to static converter circuit for latching the output of a CMOS static RAM cell output, and more particularly to a converter that can be set by level scan inputs, which has low transistor count in its implementation, and has a low power consumption.

BACKGROUND

An issue in the design of high performance static RAM (SRAM) involves the conversion of the dynamic data pulse output of the SRAM cell sense amplifier to a static signal that can be driven off the SRAM macro. There a number of prior art pulse to static converters for use with CMOS SRAM. But these prior art pulse to static converters have a high transistor count or high power consumption, or both.

SUMMARY OF THE INVENTION

An object of this invention is the provision of a pulse to static converter for CMOS SRAM's that has a low transistor count and low power consumption.

An additional object of the invention is the provision of such a low transistor count, low power consumption pulse to static converter that can be latched by level scan test bits.

Briefly, this invention contemplates the provision of a pulse to static converter for SRAM in which the converter latch is comprised of two cross-coupled, complementary, FET pairs. The FETs of each pair are coupled drain to drain between a positive voltage source and ground. The complement of the output state of SRAM sense amplifier is coupled as an input to the grates of one FET pair and the state established by this input is latched via the cross coupling with the other FET pair. During scan test operations, one phase of a complementary clock signal pair disable one of the FET pair (the latch feedback inverter) allowing a new state to be easily fed into the latch. The other phase of the clock re-enables the latch feedback inverter pair, allowing the latch to hold/store the scan data and block new scan data from entering the latch.

DETAILED DESCRIPTION OF THE INVENTION

Figure 1:
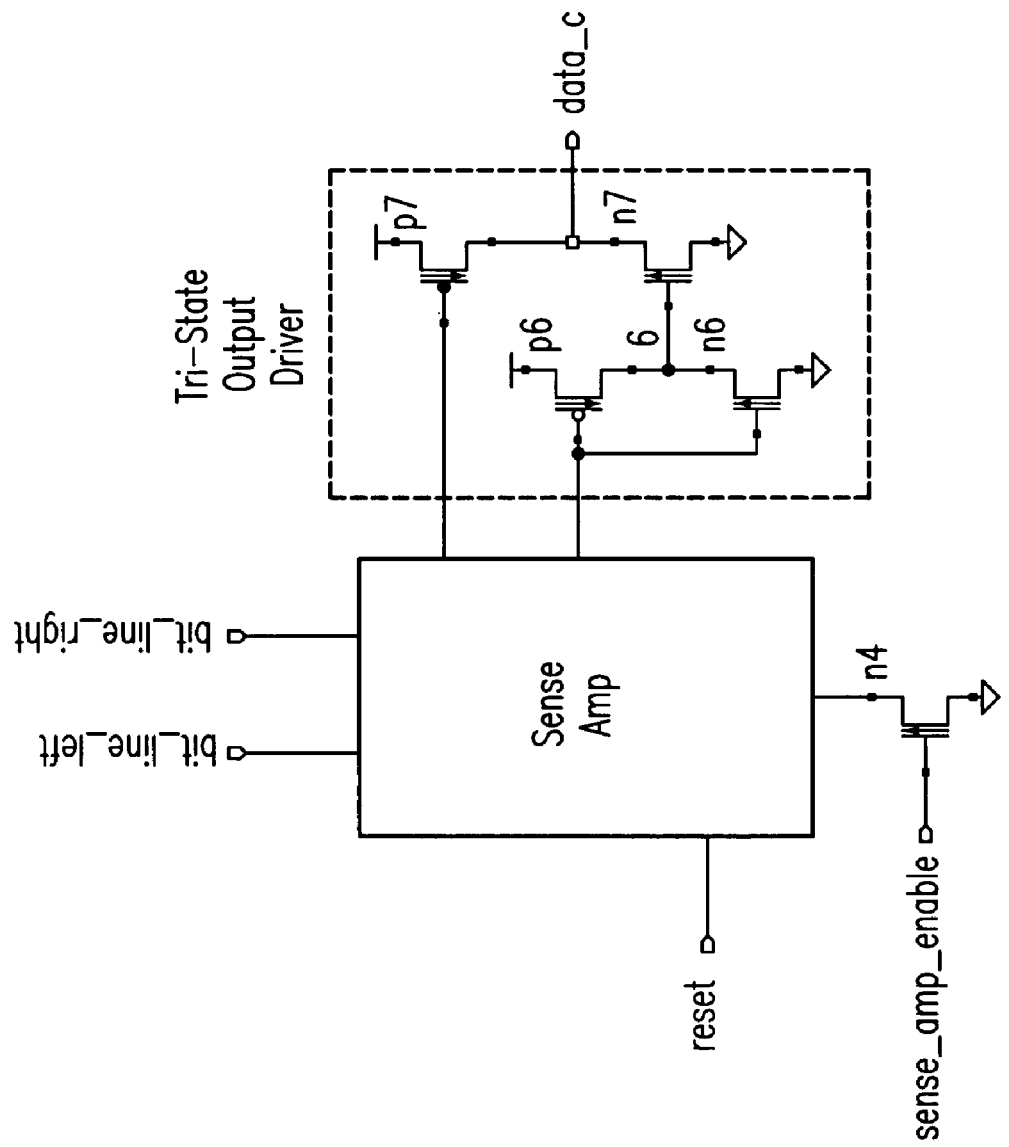
FIG. 1 is partially block and partially schematic drawing of an SRAM sense amplifier with a tri-state output.

Referring now to FIG. 1, the tri-state output, which appears on the bit lines of the Sense Amp, is coupled to a Tri-State Output Driver, comprised of an FET pair p6-n6 coupled to the sense amplifier output of one bit line and an FET pair p7-n7 coupled to the sense amplifier output of the other bit line. The output of the driver is data_c. As will be appreciated by those skilled in the art, the output of the tri-state sense amplifier has an active high output state, and an active low output state, and in its inactive state is a high impedance state.

Figure 2:
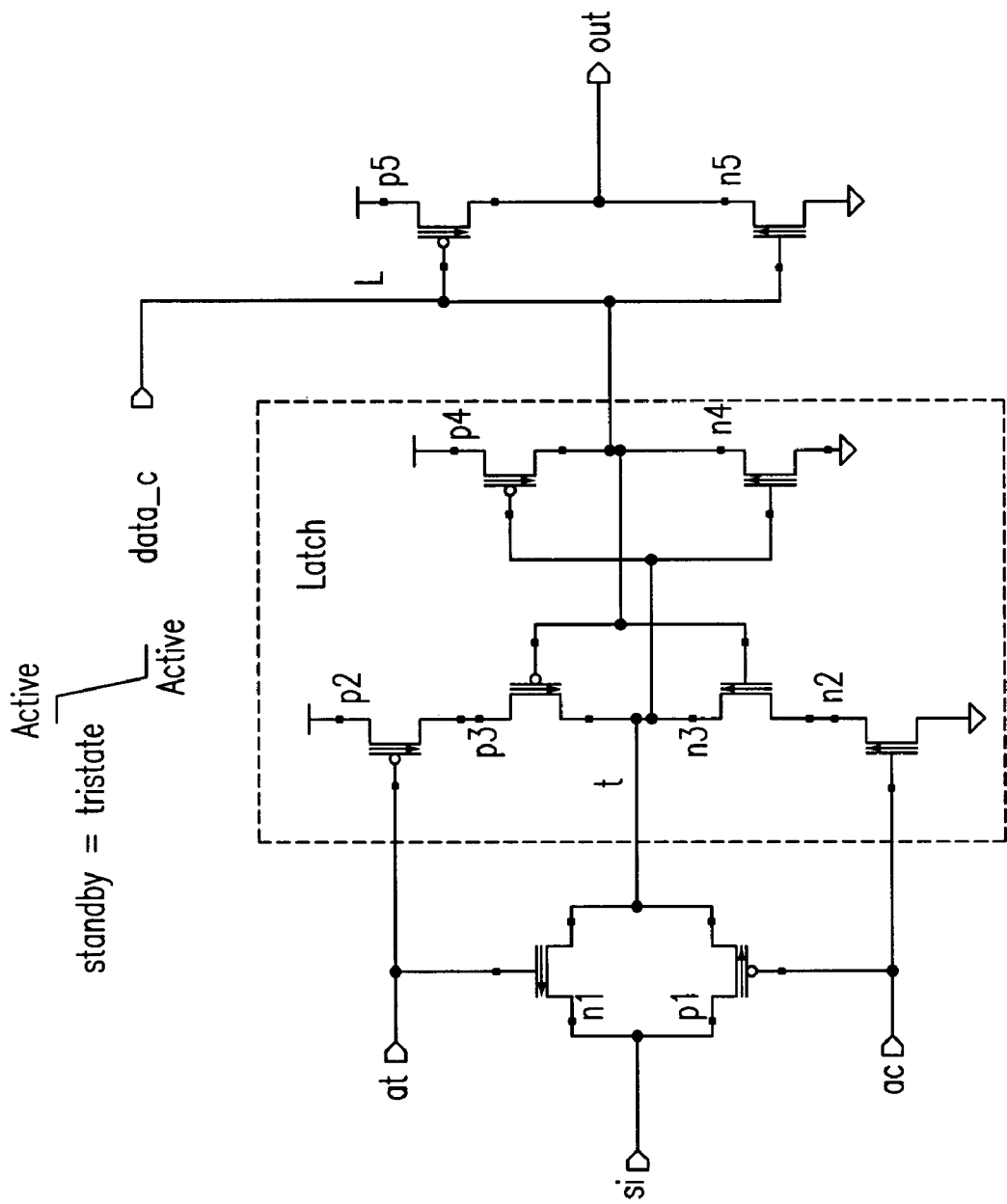
FIG. 2 is a schematic drawing of a pulse to static converter in accordance with the teachings of this invention, suitable for use with a tri-state sense amplifier of the type shown in FIG. 1.

Referring now to FIG. 2, here the input data_c is a tri-state input from the SPAN sense amplifier. The latch is comprised of FETs p3-n3 and p4-n4. The source of p3 is coupled to a positive operating potential (i.e. Vdd) via Fet p2, and the source of n3 is coupled to ground via n1. P2 and n2 serve the scan in test mode of operation and are in a conducting state during normal operation. The sources of p4 and n4 are coupled to Vdd and ground respectively. The gates of p3-n3 are coupled together and to the data_c input. The gates of p4-n4 are coupled together and to the drains of p3-n4, thus creating the latch. The drains of p4-n4 are coupled to the output driver comprised of FETs p5 and n5.

For scan test data operation, there is an input labeled "si" to which scan in test data is coupled. The inputs labeled "at" and "ac" are complementary clock inputs active during a scan test operation. The at and ac clock signals are coupled to the gates of p2 and n2, and also the gates of p1 and n1; these latter two transistors couple the si input to the latch when the clock signals are active.

In the operation of the embodiment of the invention shown in FIG. 2, during normal (non-scan) latch operation, data enters the latch through the input port labeled "data_c". Note that "data_c" is the complemented rendering of the data. This allows the proper polarity of the data to reach the output: "out". During stand-by (circuit inactivity state), the upstream Sense Amp presents a high impedance state or "tristate" on the node "data_c". This allows the previously stored "latch" data to control the voltage on "data_c". When new data from the Sense Amp is presented to the latch, the Sense Amp will take control of the "data_c" voltage by driving it to the high or low voltage state. This will force the latch and the "out" signal to the desired state. Next, the Sense Amp will return to the "tristate" condition, allowing the latch to regain control of the node "data_c" and the output node "out".

Figure 3:
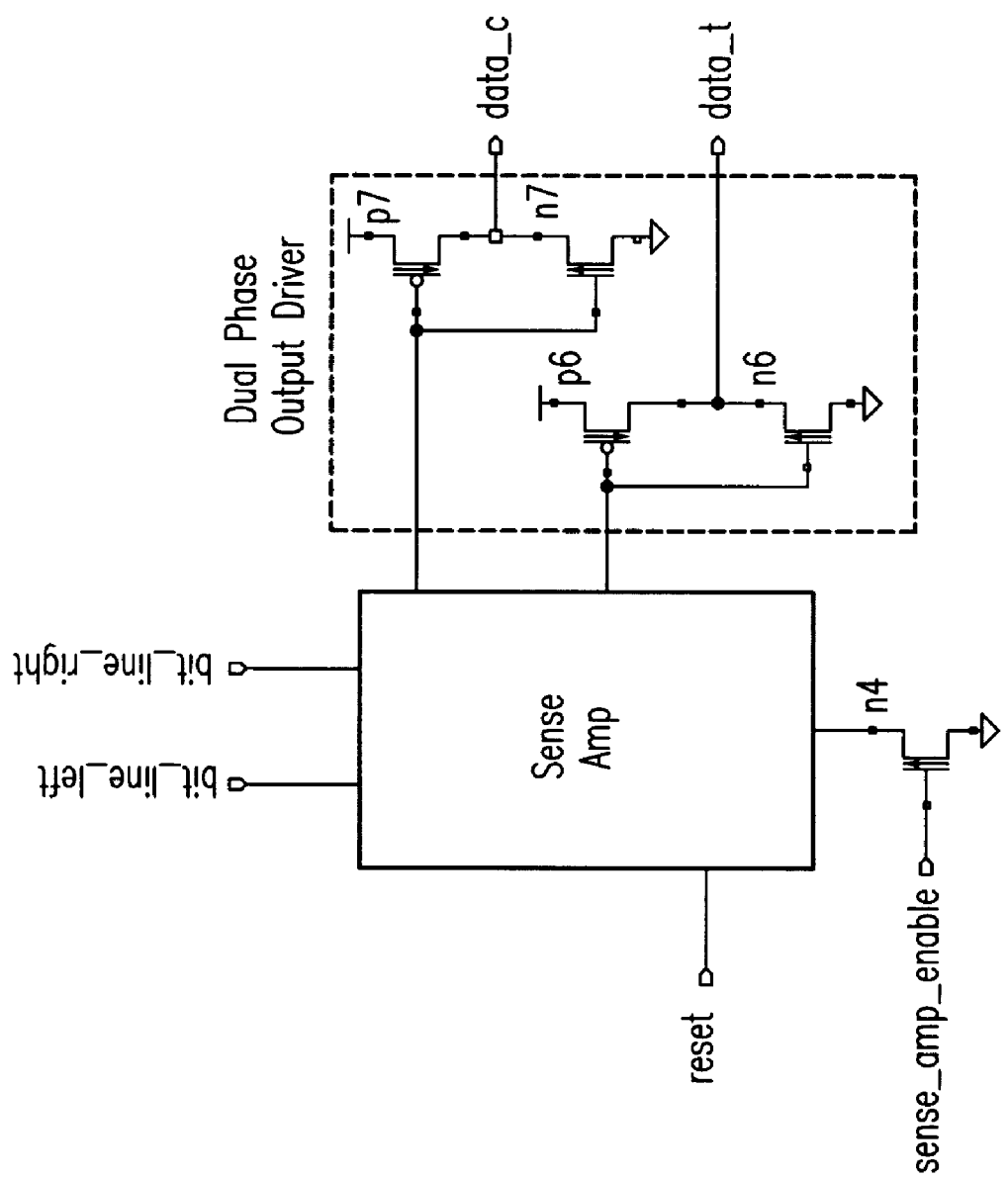
FIG. 3 is a drawing similar to FIG. 1 showing an SRAM sense amplifier with a complementary output.

Referring now to FIG. 3, here the Sense Amp has a dual phase output on its bit lines, one phase of which is coupled to the gates p7-n7 in the Dual Phase Output Driver and the other phase of which is coupled to the gates of p6-n6 of the Driver. The true and complement data outputs (where either output is driven to a high state and returns to zero at the end of the operation) are labeled data-c and data-t.

Figure 4:
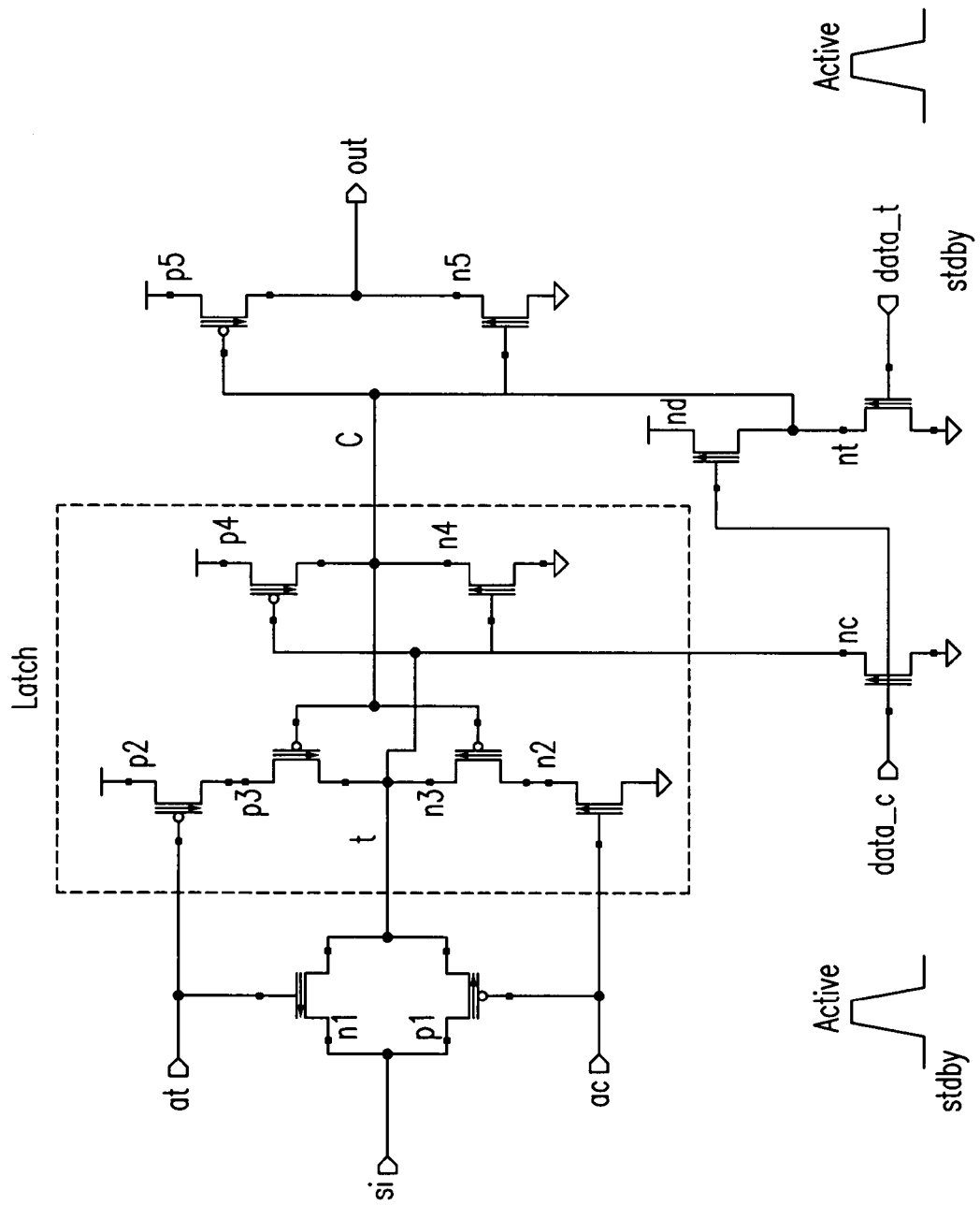
FIG. 4 is a drawing similar to FIG. 2 showing a pulse to static converter suitable for use with a complementary output of the type shown in FIG. 3.

Referring now to FIG. 4, it will be noted that the latch circuit and the scan in test data circuit are substantially the same as previously described in connection with FIG. 2. Here there are two data inputs, labeled data-c and data-t coupled to the gates of NFETs nc and nt respectively. NFET nd is connected in a source follower configuration. When the input data_c is driven to the high state, NFET nc pulls the latch node "t" to a ground state and the source follower action of nd will begin to drive the latch node "c" to the high state, which is reinforced by the latch PFET p4. As a result the output "out" will fall to the low state. The reverse is true for the input labeled data_t. When it is driven to the high state the latch node "c" will be driven to the ground state by the turning on of NFET nt so that the output node "out" will be correspondingly to a high voltage state.

In the operation of FIG. 4, during normal (non-scan) latch operation, data enters the latch through the input ports labeled "data_c" and "data_t".

Note that during an active state; the inputs labeled "data_t" and "data_c" are complementary signals, meaning that either "data_t" or "data_c" will go to the high voltage state and the other will remain at it low voltage stand-by state. During stand-by (circuit inactivity state), the upstream Sense Amp (shown in FIG. 3) presents a low voltage value for both "data_t" and "data_c". This allows the previously stored "latch" data to control the voltage on the output node labeled: "out" (in FIG. 4). When new data from the Sense Amp (in FIG. 3) is presented to the latch, the Sense Amp will drive either "data_t" or "data_c" to a high voltage state and the other will remain at it low voltage stand-by state. This action will force the latch and the node "out" to the new data state. Next, the Sense Amp will return to the standby condition, allowing the latch to maintain control of the output node "out".

In the scan test operation, as previously explained, the "latch" input labeled "si" is the "scan-in" port to the latch in both embodiments of the invention. For example, the "si" port of the latch is feed by the "out" port of the previous latch. In this way, the data in one latch is passed to the next latch, during scanning operations. The scanning operation is controlled by clock signals "at" and "ac" where "ac" has the complement phase of "at". Referring to FIGS. 2 and 4, the input ports labeled "at" and "ac" are the scan control clock inputs. During scanning, new data would be presented at the input "si" prior to the rising edge of "at" and falling edge of "ac".

When "at" and "ac" are active, the latch feedback inverter made up of p2, p3, n3, and n2 is disabled allowing the new date to easily feed into the latch. When "at" and "ac" are go in-active, the latch feedback inverter made up of p2, p3, n3, and n2 is re-enabled allowing latch to hold/store the new data and blocks new data from entering the latch. During normal latch operation, "at" and "ac" are in their in-active state.

While the preferred embodiment of the invention has been described, it will be understood that those skilled in the art, both now and in the future, may make various improvements and enhancements which fall within the scope of the claims which follow. These claims should be construed to maintain the proper protection of the invention described herein.

The invention claimed is:

1. A converter for converting to a static output from a dynamic pulse output of a CMOS SRAM sense amplifier, comprising:
   a connection coupling the dynamic pulse output of said CMOS SRAM sense amplifier to an input of a tri-state output driver circuit, said tri-state output driver circuit having an output with three states: an active high output state, an active low output state, and a high impedance output state;
   a latch circuit coupled to the output of said tri-state output driver circuit, said latch circuit including a first pair of complementary FETs coupled drain to drain between a positive source voltage and ground and a second pair of complementary FETs coupled drain to drain between said positive source voltage and said ground;
   said output of said tri-state output driver circuit coupled to the gates of said first pair of complementary FETs, wherein the drains of said first pair of complementary FETs coupled to the gates of said second pair of complementary FETs so that said active high output state and said active low output state of said tri-state output driver circuit controls the state of said latch circuit and said high impedance output state of said tri-state output driver circuit and maintains the state of said latch circuit;
   an output circuit connected to the drains of said second pair of complementary FETs; and
   a scan in port for scanning test data through said latch circuit and a scan operation clock signal input that disables said latch circuit during test data scanning.

2. A circuit for converting to a static output a dynamic pulse output of a CMOS SRAM sense amplifier as in claim 1 wherein said output circuit includes an inverter comprised of third pair of complementary FETs.

* * * * *